(12) United States Patent
Moyer et al.

(10) Patent No.: US 7,185,251 B2
(45) Date of Patent: Feb. 27, 2007

(54) METHOD AND APPARATUS FOR AFFECTING A PORTION OF AN INTEGRATED CIRCUIT

(75) Inventors: William C. Moyer, Dripping Springs, TX (US); William C. Bruce, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 229 days.

(21) Appl. No.: 10/157,094

(22) Filed: May 29, 2002

(65) Prior Publication Data

US 2003/0226080 A1  Dec. 4, 2003

(51) Int. Cl.
*G01R 31/28* (2006.01)
(52) U.S. Cl. .................... 714/729; 714/733
(58) Field of Classification Search ............. 714/729, 714/733
See application file for complete search history.

(56) References Cited

U.S. PATENT DOCUMENTS

| | | | | |
|---|---|---|---|---|
| 5,189,675 A | * | 2/1993 | Nozuyama et al. | 714/726 |
| 5,228,045 A | * | 7/1993 | Chiles | 714/726 |
| 5,477,548 A | * | 12/1995 | Beenker et al. | 714/727 |
| 5,677,916 A | | 10/1997 | Nozuyama | |
| 6,041,176 A | | 3/2000 | Shiell | |
| 6,073,254 A | * | 6/2000 | Whetsel | 714/30 |
| 6,115,763 A | * | 9/2000 | Douskey et al. | 710/72 |
| 6,311,302 B1 | * | 10/2001 | Cassetti et al. | 714/727 |
| 6,334,198 B1 | * | 12/2001 | Adusumilli et al. | 714/727 |
| 6,378,090 B1 | * | 4/2002 | Bhattacharya | 714/724 |
| 6,385,749 B1 | | 5/2002 | Adusumilli | |
| 6,405,335 B1 | * | 6/2002 | Whetsel | 714/726 |
| 6,631,504 B2 | * | 10/2003 | Dervisoglu et al. | 716/4 |
| 6,754,863 B1 | * | 6/2004 | Grannis, III | 714/729 |
| 6,760,876 B1 | * | 7/2004 | Grannis, III | 714/729 |
| 6,813,739 B1 | * | 11/2004 | Grannis, III | 714/729 |
| 6,961,884 B1 | * | 11/2005 | Draper | 714/726 |

OTHER PUBLICATIONS

Whetsel, "An IEEE 1149.1 Based Test Access Architecture for ICs with Embedded Cores," IEEE International Test Conference, Paper 3.3, pp. 69-78 (1997).

* cited by examiner

*Primary Examiner*—Joseph D. Torres
(74) *Attorney, Agent, or Firm*—Susan C. Hill; Joanna G. Chiu

(57) ABSTRACT

In one embodiment, an integrated circuit which uses one or more re-useable modules may use a signature generated by a duplicate state machine or an unmodified state machine to select, control, or otherwise affect a resource on the integrated circuit, where affecting the resource was not part of the original design and state diagram of the unmodified state machine. In one embodiment, a method and apparatus is provided for dynamically reconfiguring a plurality of test circuits in re-useable modules on an IC without modifying the controller state machine in the re-usable module.

8 Claims, 8 Drawing Sheets

# METHOD AND APPARATUS FOR AFFECTING A PORTION OF AN INTEGRATED CIRCUIT

FIELD OF THE INVENTION

The invention relates generally to an integrated circuit, and more particularly to a method and apparatus for controlling a portion of the integrated circuit.

BACKGROUND OF THE INVENTION

As integrated circuits become larger and more complex, it is important to improve the control methodology and structure that is used to control various portions of the integrated circuit (IC). Also, one of the methods employed to reduce IC design time is to combine re-usable modules into a single integrated circuit. Re-usable modules can vary from small specialized functional blocks such as an integer multiplier to modules that were formerly an entire IC such as a microprocessor. In addition, re-usable modules can exist in many forms ranging from a synthesizable model which can be readily modified to a physical model which cannot be modified. When un-modifiable re-usable modules are combined in an integrated circuit, problems can arise when attempting to combine them such that new functionality is available at the IC level while retaining the capability to utilize, test, and control all of the functionality of individual re-usable modules. It is thus becoming increasingly important to be able to integrate the control and testing of various re-useable IC portions or modules that were originally designed to be used in different ICs.

BRIEF DESCRIPTION OF THE DRAWINGS

The present invention is illustrated by way of example and is not limited to the embodiments illustrated in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
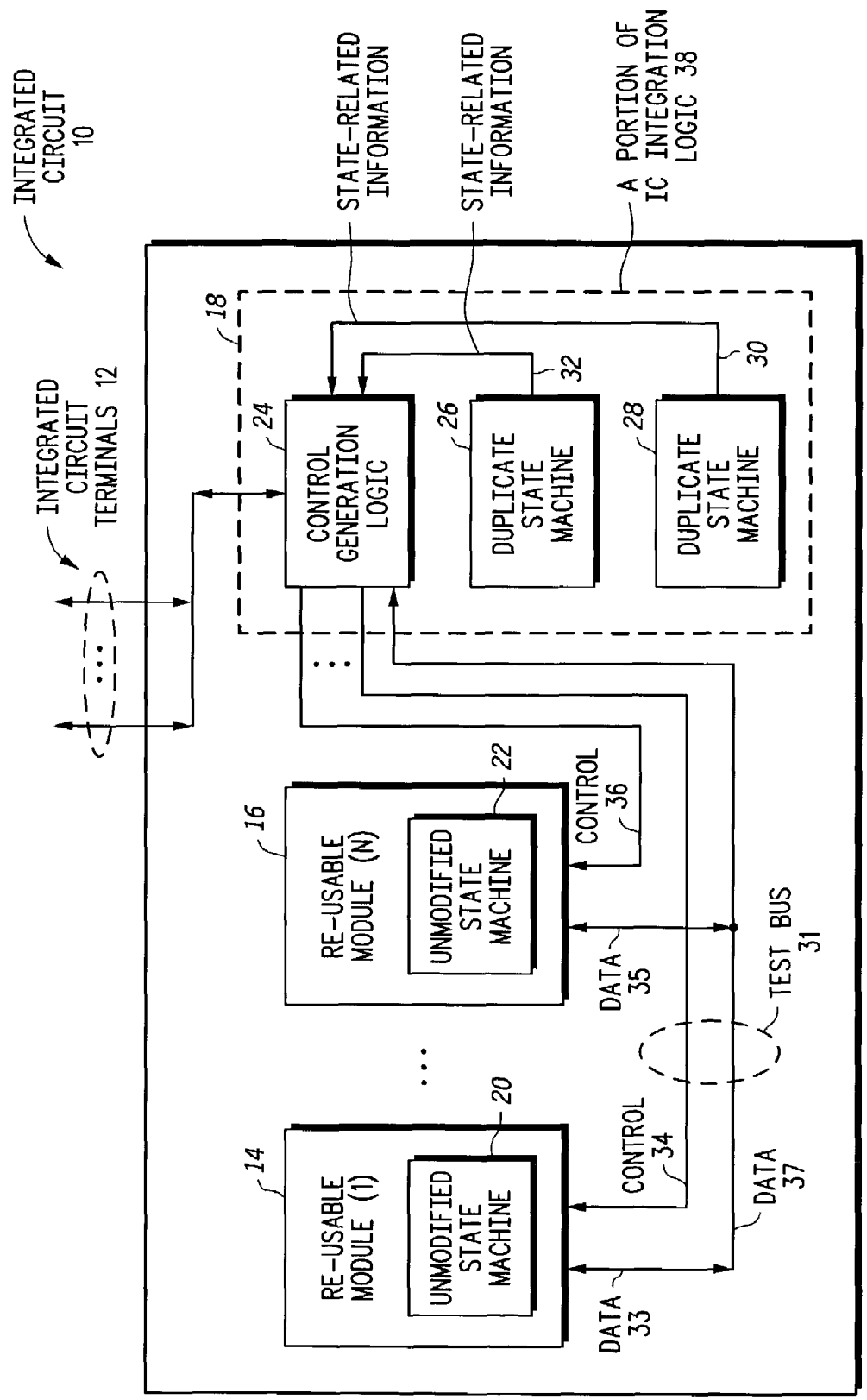
FIG. 1 illustrates, in block diagram form, one embodiment of an integrated circuit 10 in accordance with the present invention.

FIG. 1 illustrates an exemplary integrated circuit 10 with integrated circuit terminals 12. Integrated circuit 10 includes a plurality of re-usable modules, namely re-usable module (1) 14 to re-usable module (N) 16. Alternate embodiments of the present invention may use any number of reusable modules. Re-usable modules 14 and 16 include unmodified state machines 20 and 22, respectively. User control of the re-usable modules 14, 16 is provided by a portion of IC integration logic 38. Logic 38 includes control generation logic 24 and a plurality of duplicate state machines 26 and 28. Duplicate state machines 26 and 28 duplicate operation of the unmodified state machines 20 and 22 in re-usable modules 14 and 16. Alternate embodiments of the present invention may include any number of unmodified state machines 20, 22, and any number of duplicate state machines 26, 28. Additionally, alternate embodiments of the present invention may include a plurality of unmodified state machines 20, 22, and a single duplicate state machine 26, or may contain a plurality of duplicate state machines 26, 28 corresponding to one or more unmodified state machines 20, 22. Circuit 18 includes control generation logic 24 and the plurality of duplicate state machines 26, 28. Communications and control between the IC integration logic 38 and the re-usable modules 14 and 16 are provided by control bus 34 and 36, along with data bus 33 and 35 which together comprise data bus 37. In one embodiment, test bus 31 includes control bus 34 and data bus 37. In the illustrated embodiment, each re-usable module (1) to (N) has one or more associated control signals (e.g. control bus 34) that are used to provide control information from logic 38 to that particular reusable module. Communication between control generation logic 24 and duplicate state machines 26 and 28 is provided by state-related information buses 32 and 30. Integrated circuit terminals 12 may optionally be used to allow logic 38 to provide and receive information external to integrated circuit 10.

A specific example will be described for illustrative purposes only. The invention is by no means intended to be limited to this specific example. As an example, it is desired to improve the control methodology and structure of an integrated circuit 10 which combines two or more re-usable modules (e.g. 14, 16) when each re-usable module includes an IEEE (Institute of Electrical and Electronic Engineers) Standard 1149.1 Test Access Port that provides unique functionality. The IEEE Standard Test Access Port and Boundary Scan Architecture (IEEE Standard 1149.1) is a well known IEEE test standard that provides access to scan registers within integrated circuits (ICs). IEEE Standard 1149.1 defines a five-pin dedicated test bus consisting of four inputs and one three-state output. The inputs are test clock (TCK), test mode select (TMS), test data input (TDI), and test reset (TRST). The output is test data output (TDO).

Figure 2:
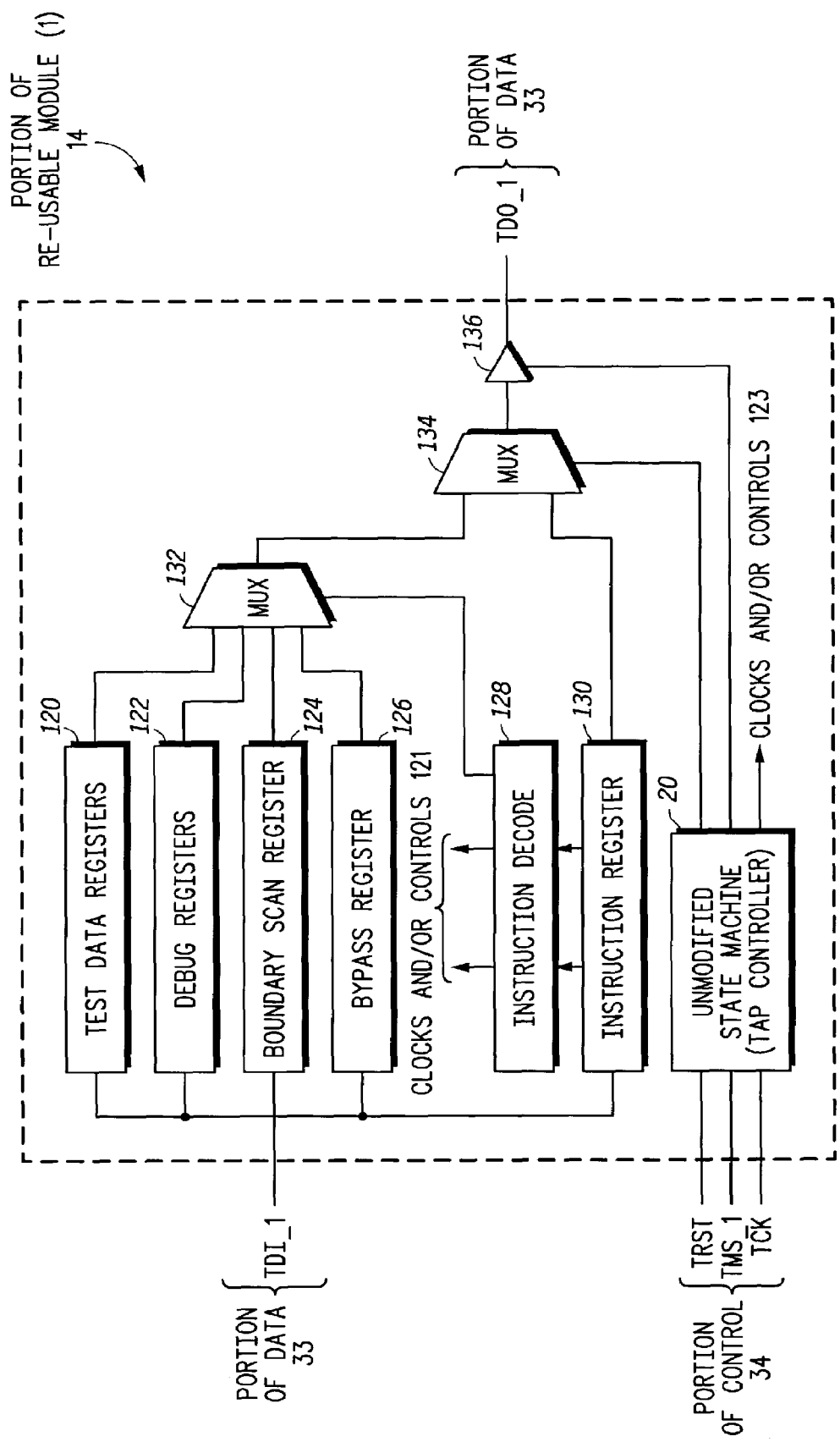
FIG. 2 illustrates, in block diagram form, one embodiment of a portion of re-useable module (1) 14 of FIG. 1 in accordance with the present invention.

FIG. 2 illustrates, in block diagram form, one embodiment of a portion of re-useable module (1) 14 of FIG. 1 in accordance with the present invention. In one embodiment of the present invention, the logic illustrated in FIG. 2 is capable of meeting the IEEE Standard 1149.1. Note that one or more of the other re-usable modules (N) 16 may use this same logic, or a variation thereof. In one embodiment of the present invention, inputs to the re-usable module (1) include a portion of data bus 33 that includes custom signal TDI_1, and a portion of control bus 34 that includes global signals TRST and TCK and custom signal TMS_1. Note that in one embodiment of the present invention, the custom signals TDI_1 and TMS_1 are coupled only to re-usable module (1). The portion of re-usable module (1) shown in FIG. 2 also includes an unmodified state machine 20 (TAP controller) which corresponds to the unmodified state machine 20 in FIG. 1. The portion of re-usable module (1) shown in FIG. 2 also includes an instruction register 130 and associated instruction decode circuitry 128, as well as test data registers 120, bypass register 126, boundary scan register 124, and debug registers 122.

The instruction register 130 is decoded by instruction decoder 128 to generate outputs (clocks and/or control signals 121) which control multiplexor (MUX) 132 to select one data register from the plurality of test data registers 120, debug registers 122, boundary scan register 124, and bypass register 126. The test access port (TAP) controller 20 generates a set of outputs (nine outputs for the IEEE Standard 1149.1), including clocks and/or controls 123. The outputs of TAP controller 20 control all data capture and register shift operations, as well as selection of either a test data register output or an instruction register output by controlling multiplexor 134. A TAP controller 20 output also controls whether the custom test data output (TDO_1) signal is off or driving by enabling or disabling output driver 136.

Figure 3:
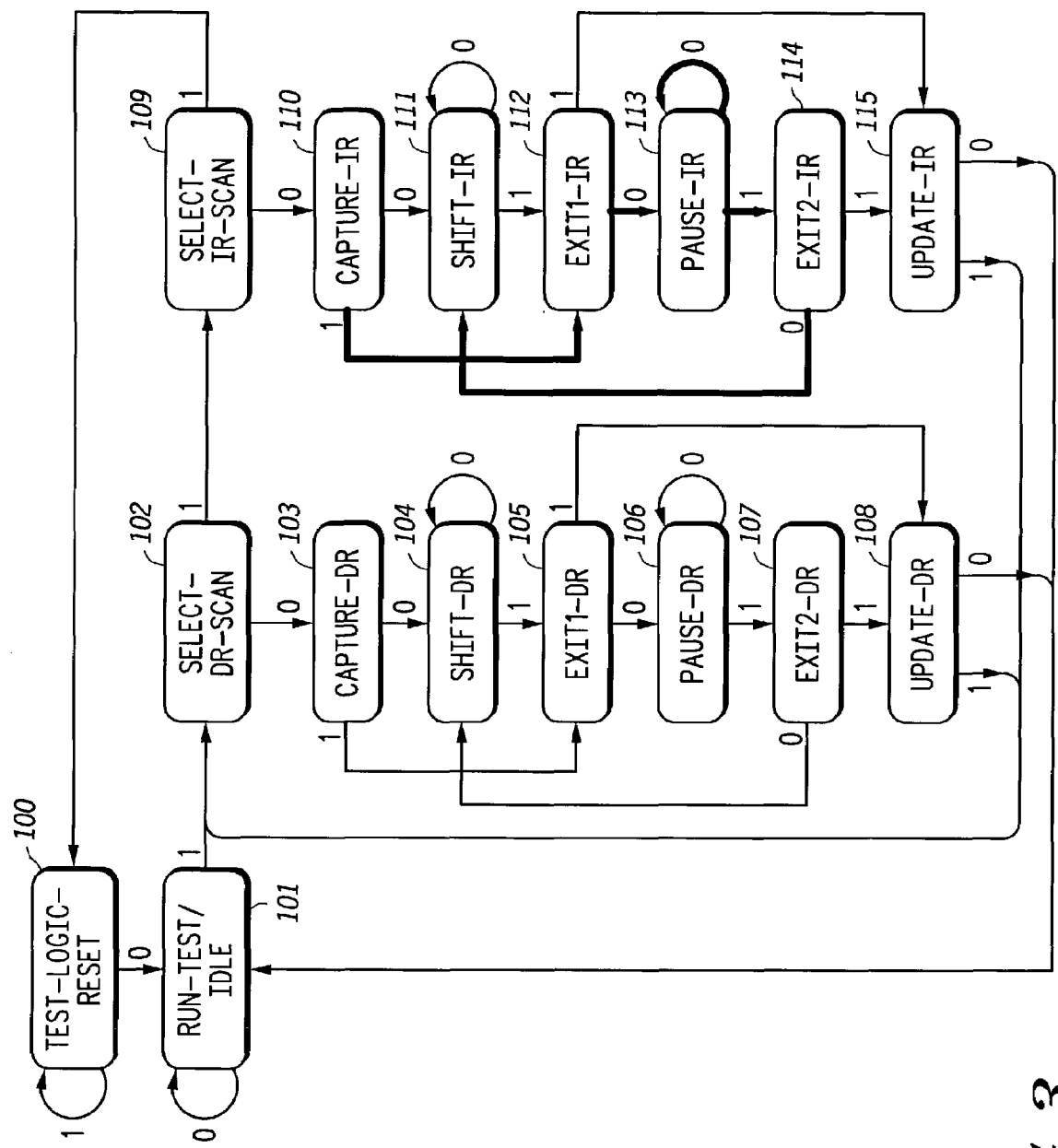
FIG. 3 illustrates, in state diagram form, one embodiment of a state diagram for unmodified state machine 20 of FIG. 1 in accordance with the present invention.

FIG. 3 shows a well-known state diagram defined by IEEE Standard 1149.1 for a test access port (TAP) controller. In one embodiment, this state diagram is executed by each of the state machines 20, 22, 26, 28 shown in FIG. 1. For illustrative purposes, further discussion will refer to TAP controller 20, although the description is applicable to TAP controllers 22, 26, and 28 as well. The TAP controller 20 samples the test mode select (TMS) input on each rising edge of the test clock (TCK) to control the transition between states. The logic state of TMS is shown beside the transition paths connecting the states. Some state transition paths are shown in bold (i.e. as heavier lines) and will be discussed in more detail herein below. However, for purposes of the following discussion, the bold state transitions are identical to non-bold transitions.

The TAP controller 20 is forced to the Test-Logic-Reset state 100 in response to a power-up reset signal, a low level on TRST, or an appropriate input sequence on the TMS signal. If the TMS signal is held high for five consecutive TCK rising edges, the TAP controller 20 will always transition to the Test-Logic-Reset state 100. The number of consecutive TCK rising edges to reach the Test-Logic-Reset state 100 depends upon the current state but cannot exceed five. If less than five consecutive TCK rising edges are required, the TAP controller 20 will reach the Test-Logic-Reset state in fewer transitions, but will then remain in the Test-Logic-Reset state 100.

The TAP controller 20 will remain in the Test-Logic-Reset state 100 until a TCK rising edge occurs with TMS low, which will result in a transition to Run-Test/Idle state 101. The TAP controller 20 will remain in the Run-Test/Idle state 101 if TMS remains low; otherwise, the TAP controller 20 will transition to the Select-DR-Scan state 102. From the Select-DR-Scan state 102, the TAP controller 20 will transition to either Capture-DR state 103 or to Select-IR-Scan state 109 depending upon whether TMS is low or high, respectively.

The six states depicted below Select-DR-Scan state 102 (namely states 103, 104, 105, 106, 107 and 108) have analogous functionality to the six states depicted below Select-IR-Scan state 109 (namely states 110, 111, 112, 113, 114 and 115) except that the states under state 102 control test data register operations whereas the states under state 109 control instruction register operations.

Capture-DR state 103 initiates a data register scan operation. The TAP controller 20 transitions through Capture-DR state 103 to load parallel data into a data register selected by instruction register decode (128 of FIG. 2). If TMS is high, the data register shift operation is skipped and the Exit 1-DR state 105 is entered. If TMS is low during the Capture-DR state 103, the Shift-DR state 104 is entered and the test data register selected by instruction decode 128 is shifted from TDI to TDO. The data register shift operation can be paused by transitioning to Pause-DR state 106 via Exit 1-DR state 105, and resumed by subsequently returning to Shift-DR state 104 via Exit 2-DR state 107. At the end of the data register shift operation, the TAP controller 20 always transitions through Update-DR state 108 via Exit 2-DR state 107 or Exit 1-DR state 105 to load new parallel data from the test data update register to the test data register selected by instruction decode 128, and thereby complete the test data register scan operation. From Update-DR state 108, the TAP controller 20 can transition to either Run-Test/Idle state 101 or to Select-DR-Scan state 102 depending upon whether TMS is low or high, respectively.

If Select-IR-Scan state 109 is entered, the TAP controller 20 can transition into the Capture-IR state 110 to initiate an instruction register scan operation or to Test-Logic-Reset state 100, depending upon whether TMS is low or high, respectively. If the transition is to an instruction register scan operation, operations in the Capture-IR 110, Shift-IR 111, Exit 1-IR 112, Pause-IR 113, Exit 2-IR 114, and Update-IR 115 states are analogous to those performed in analogous states for the test data register scan operation. Next state transitions from the Update-IR state 115 can be either to the Run-Test/Idle state 101 or to the Select-DR scan state 102 depending upon whether TMS is low or high, respectively.

If the TAP controller 20 transitions from the Select-IR scan state 109 into the Test-Logic-Reset state 100, the TAP controller 20 will generate a control signal to initialize the instruction register (130 of FIG. 2) and to reset user-selected bits of predetermined registers (e.g. 120, 122 and 124 of FIG. 2).

The term "TAP" referred to hereafter will be understood to comprise a TAP controller (e.g. 20), an instruction register (e.g. 130), test data registers (e.g. 120, 122, 124 and 126), and TDO multiplexing (132, 134) as shown in FIG. 2 and defined by IEEE Standard 1149.1.

The IEEE Standard 1149.1 was developed by the electronic test community under the assumption that an IC would include only a single TAP. Today, however, ICs may include multiple TAPs because ICs are being designed using re-usable modules wherein each module may include a TAP. A re-usable module is a complete circuit function, such as a digital signal processor, a CPU, a test control block, or any other functional block, and may have its own TAP that can be used as a sub-circuit to access registers within the re-usable module (e.g. 14 of FIG. 1) from an external 1149.1 test bus (e.g. test bus 31 of FIG. 1).

Therefore, an IC that contains multiple re-usable modules could include multiple TAPs. The problems posed by this situation is that only a single IC-level TAP should be visible in order to meet the IEEE 1149.1 Standard, but access to the re-usable module TAPs is also needed in order to achieve access to the internal registers of the re-usable module. Therefore, some kind of IC-level control circuitry must be used to provide access from the external IEEE Standard 1149.1 test bus (e.g. test bus 31) to the IC-level TAP (e.g. a portion of logic 38) and to each of the TAPs included in the re-usable modules (e.g. 14).

Prior art has proposed a solution to this problem which provides access to a single register via any selected TAP controller whose state machine control can be selectively overridden by an externally generated signal which drives the selected TAP controller state machine to a desired state. The method also provides one or more additional TAP instructions that are decodable to select an external data path. Sequential access of TAPs from a single IEEE Standard 1149.1 TAP interface permits test operations associated with different TAPs to time-wise overlap each other.

A very significant problem inherent in the solution taught by the prior art is that the IEEE Standard 1149.1 TAP controller state machine in each re-usable module 14, 16 must be modified to comprehend additional instruction(s) and an additional control input; and must modify its state diagram so that when in the Update-DR state (108 of FIG. 3), it transitions to either the Run-Test/Idle state (101 of FIG. 3) or the Select-DR Scan state (102 of FIG. 3) based on the value of the additional input. The effect of this additional control input is to provide a means of selecting a new active TAP controller while forcing non-selected TAPs into an idle state. While this approach is workable for new devices, it is not workable for physical designs that cannot be changed and, therefore, cannot be used.

The present invention addresses the problem that is not solved by the prior art approach. The present invention imposes an additional, and very important constraint upon the solution: the TAP controller state machine for the re-usable modules cannot be changed. This is the real-world situation for many ICs. In many cases it is not possible or is prohibitively expensive to change the TAP controller state machines in one or modules on a chip that are being reused. In one embodiment, the present invention allows the selection and control of individual TAPs using the IEEE Standard 1149.1 external test bus, while not requiring any changes in the TAP controller state machine for the reusable modules. In one embodiment, the present invention provides a method for dynamically reconfiguring multiple TAPs in an IC without modifying the standard TAP controller state machine of the re-usable module. Finally, no additional IC pin/terminal or external terminal resources are required for some embodiments of the invention.

Figure 4:
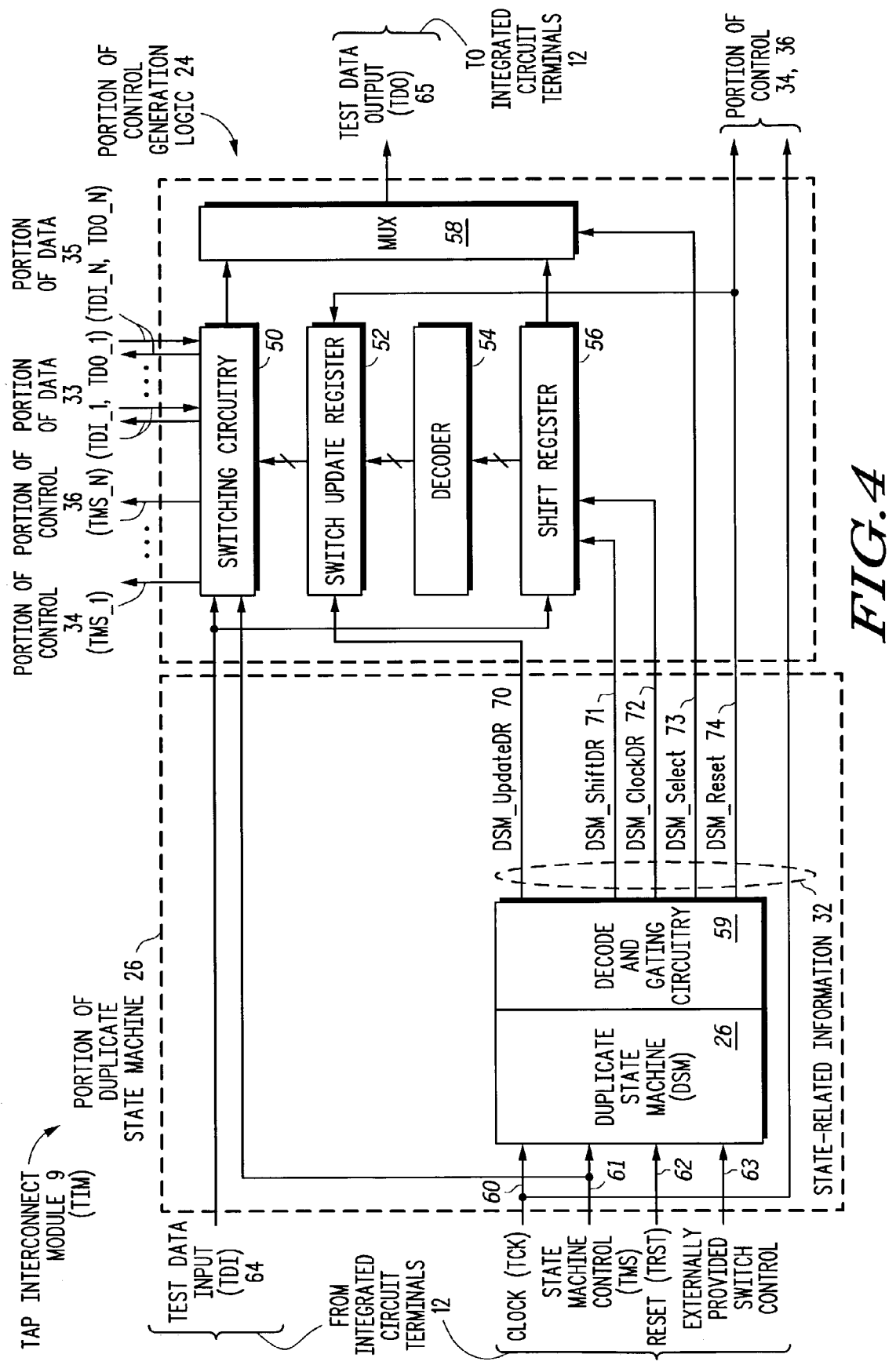
FIG. 4 illustrates, in block diagram form, one embodiment of a portion of circuit 18 of FIG. 1 in accordance with the present invention.

FIG. 4 illustrates, in block diagram form, one embodiment of a portion of circuit 18 of FIG. 1 in accordance with the present invention. FIG. 4 illustrates one way in which a duplicate state machine (e.g. 26 of FIG. 1) may be coupled to external inputs, including test clock (TCK) 60, test mode select (TMS) 61, test reset (TRST) 62, and switch control 63. The switch control signal 63 is used to allow the contents of the switch update register 52 to be altered, which in turn, controls switching circuitry 50. The outputs of the illustrated portion of control generation logic 24 are control signals 34 and 36 (including the TMS signals for modules 1 through N), and data signals 33 and 35 for each of the reusable modules (including the TDI and TDO signals for each module 1 through N). Duplicate state machine (DSM) 26 provides state machine synchronization with other identical state machines in the re-usable modules by way of state-related information 32. Decode and gating circuitry 59 utilizes the current state of DSM 26 and switch control 63 to generate output control signals DSM_UpdateDR 70, DSM_ShiftDR 71, DSM_ClockDR 72, DSM_Select 73, and DSM_Reset 74 for use in controlling the configuration of all of the unmodified state machines (e.g. 20, 22) in the re-usable modules (e.g. 14, 16) of integrated circuit 10.

In one embodiment of the present invention, a TAP Interconnect Module (TIM) 9 is coupled to each re-usable module (e.g. 14, 16) of FIG. 1 via the IEEE Standard 1149.1 test bus, with each TAP having a dedicated connection. Alternate embodiments could use other test bus protocols for test bus 31 (see FIG. 1). In one embodiment, the TIM 9 consists of a master-level TAP controller (Duplicate State Machine 26 along with decode and gating circuitry 59), a serial shift register 56 coupled to a decoder 54 which provides control input to a switch update register 52, and switching circuitry 50. In response to the DSM_UpdateDR signal 70, the contents of the switch update register 52 are updated from decoder 54 and transferred to switching circuitry 50, and are used along with the test data input signal (TDI) and the test mode select signal (TMS) to separately control each of the TAPs in the re-usable modules 14, 16. The TAP controller in the TIM 9 follows the IEEE Standard 1149.1 pin/terminal signals through the standard TAP states as shown in FIG. 3. The switch update register 52 is used to control the configuration of the multiple TAPs within the re-usable modules 14, 16.

The function of the TIM 9 is to serve as the IC-level TAP controller and to allow individual selection of TAPs within multiple re-usable module 14, 16. The TIM 9 generates a common reset and test clock signals for each re-usable module TAP, along with a set of individual control signals (TDI_1 through TDI_N and TMS_1 through TMS_N). The TIM 9 receives a unique output TDO_1 through TDO_N, where N is the total number of TAPs for all re-usable modules 14, 16.

Switching circuitry 50 included within the TIM 9 couples individual TDI and TDO signals for selected TAPs (1 through N) together to form a serial scan chain with the TAPs in any desired order under software or hardware control. The necessity to generate individual control signals, e.g. TDI_1 through TDI_N, rather than to simply broadcast it from the IC TDI input pin/terminal 12 depends upon the method used to implement the Select signal for TIM 9. In FIG. 4, the TIM Select signal (switch control 63) is provided by way of an external IC pin/terminal 12. Alternate embodiments of the present invention may control the TIM 9 from on-board IC 10 by way of built-in test circuitry on IC 10 (not shown).

The duplicate state machine (DSM) 26 shown in FIG. 4 follows the state machine diagram shown in FIG. 3 and enables the TIM 9 to track the state of the unmodified TAP state machines (20, 22 of FIG. 1) in the re-usable modules 14, 16. The TIM 9 TAP controller also provides a Reset signal by way of control signals 34, 36 to each of the TAP state machines in the re-usable modules 14, 16, which is asserted by either an external TRST signal through integrated circuit terminals 12, or by the TIM 9 TAP controller reaching the Test-Logic/Reset state 100 (See FIG. 3). When the TIM select control signal (switch control 63) is asserted, the TIM 9 TAP controller will be enabled to generate the DSM_ShiftDR signal 71, the DSM_ClockDR signal 72, DSM_UpdateDR signal 70, and the DSM_Select signals 73 (which are functionally analogous to the ShiftDR, ClockDR, UpdateDR, and Select signals as defined in IEEE Standard 1149.1) while in the appropriate states. Decode and gating circuitry 59 provides control logic for the TIM shift register 56, decoder 54, switch update register 52, and switching circuitry 50.

Serial input data provided by the IEEE Standard 1149.1 test bus signal TDI 64 is presented to the TIM shift register 56 and decoded as illustrated in FIG. 4. When the TIM 9 is selected by assertion of the externally provided switch control signal 63, and the TIM Tap controller reaches the Update-DR state (108 in FIG. 3), DSM_UpdateDR 70 will be asserted, and the switch update register 52 is updated with a new value from decoder 54 which is used to control the switching circuitry 50 illustrated in FIG. 4.

All of the TAPs in re-usable modules 14, 16 receive identical TCK and DSM_Reset control signals by way of control signals 34 and 36. Switching circuitry 50 controls selection and scan chain ordering of re-usable module 14, 16 by supplying individual IEEE Standard 1149.1 test bus signals TMS and TDI, respectively, to each of the TAPs in re-usable modules 14, 16. Flexibility exists to select one or more TAPs in re-usable modules 14, 16 and to concatenate the individual instruction and data registers of the desired re-useable module(s) 14, 16. No modification of the IEEE Standard 1149.1 TAP implementation in re-useable modules 14, 16 is required.

All disabled TAPs in re-useable modules 14, 16 will be "parked" in the Run-Test/Idle state 101 (see FIG. 3) by the switching circuitry 50 forcing a zero (0) onto the TMS signal of each TAP to be disabled during the falling edge of TCK while the TAP state machine is in the Update-DR state 108, which forces the TAP into the Run-Test/Idle state 101 on the next rising edge of TCK. Disabled TAP controllers will remain in the Run-Test/Idle state 101 while the TMS signal remains forced to zero (0).

In one embodiment of the present invention, the state of all enabled TAPs in re-useable modules 14, 16 are required to be in the same state. Therefore, there must be a method to assure state synchronization of enabled and re-enabled modules. To enable or re-enable a TAP in re-useable modules 14, 16, the switching circuitry 50 couples the TMS inputs of these re-useable modules 14, 16 to the customized TMS signals 34 and 36 during the falling edge of TCK 60 while the TIM 9 TAP state machine is in the Update-DR state 108. The TMS inputs of these re-useable modules 14, 16 will be sampled on the next rising edge of TCK 60. The subsequent state for all enabled TAP controllers will be either Run-Test/Idle 101 if TMS is zero (0), or Select-DR-Scan 102 if TMS is one (1). To ensure that newly disabled TAP controllers in re-useable modules 14, 16 enter the Run-Test/Idle state 101, their TMS inputs are driven to zero (0) during the falling edge of TCK 60 while the TIM 9 TAP state machine is in the Update-DR state 108. The TMS inputs will be sampled on the next rising edge of TCK. The subsequent state for the newly-disabled TAP controllers will be Run-Test/Idle 101 since the TMS inputs for these TAP controllers in re-useable modules 14, 16 are zero (0). The TMS inputs for the disabled TAP controllers will remain driven to zero (0) independent of the value of TMS 61 until such time that new switching configuration information is provided to switching circuitry 50 which causes a disabled TAP controller in re-useable modules 14, 16 to become re-enabled. By doing so, the disabled TAP controllers will remain in the Run-Test/Idle 101 state.

By performing all switching activity in the Update-DR state 108, synchronization of all state machines in the Select-DR state 102 of enabled and re-enabled TAP controllers in re-useable modules 14, 16 is assured. If TMS is forced low, namely zero (0), while in the Update-DR state 108, all TAP controllers in re-useable modules 14, 16 will be in the Run/Test-Idle state 101 after the next rising edge of TCK. Alternatively, if TMS is driven high, namely one (1), while in the Update-DR state 108, all enabled TAP controllers in re-useable modules 14, 16 will transition to the Select-DR state 102 on the next rising edge of TCK, while disabled TAP controllers in re-useable modules 14, 16 will transition to or remain in the Run-Test/Idle state 101.

In one embodiment of the present invention, scan chain configuration is controlled by switching circuitry 50 by coupling the external signal TDI 64 to the TAP controller for the first enabled re-useable module 14, 16. The TDO output of this re-useable module 14, 16 is then multiplexed to the TDI input of the next enabled re-useable module 14, 16 by means of switching circuitry 50. This process continues for each enabled re-useable module 14, 16. The TDO output of the last enabled re-useable module 14, 16 is coupled to the output multiplexor 58 which drives the test data output (TDO) 65. The TDI input for disabled re-useable modules 14, 16 is of no consequence, and may be driven to either one (1) or zero (0) by switching circuitry 50.

Selection of re-useable modules 14, 16 and scan chain ordering is controlled by switching circuitry 50. The configuration can be changed by scanning a new control word into shift register 56, which is decoded by decoder 54. The decoded value is transferred to the switch update register 52 during the Update-DR state 108 by the TIM 9 TAP controller when output DSM_UpdateDR 70 is asserted. For this sequence of operations to occur, however, the TIM 9 module must be selected; otherwise, the DSM_UpdateDR signal 70 will not be asserted in the Update-DR state 108, and the switch update register 52 will not be changed.

In the embodiment of the present invention illustrate in FIG. 4, selection of the TIM 9 is controlled by an external select pin/terminal which is shown as the externally provided switch control input 63 of FIG. 4. This TIM 9 select pin/terminal 12 (See FIG. 1) may either be sampled, and latched during the Update-IR state 115 or may be required to remain asserted during a subsequent entry of new configuration information, depending on the specific embodiment of the current invention. When the Shift-DR state 104 is subsequently entered, the serial shift register 56 receives a new value which is then decoded. If, and only if, the external TIM 9 select pin/terminal 12 is asserted (or was captured as asserted during the previous Update-IR state 115 for some embodiments), control signal $DSM_{13}$ UpdateDR 70 is asserted and the decoder 54 output is latched into the switch update register 52, thus changing the selection and ordering of TAPs in re-useable modules 14, 16 as controlled by switching circuitry 50.

Figure 5:
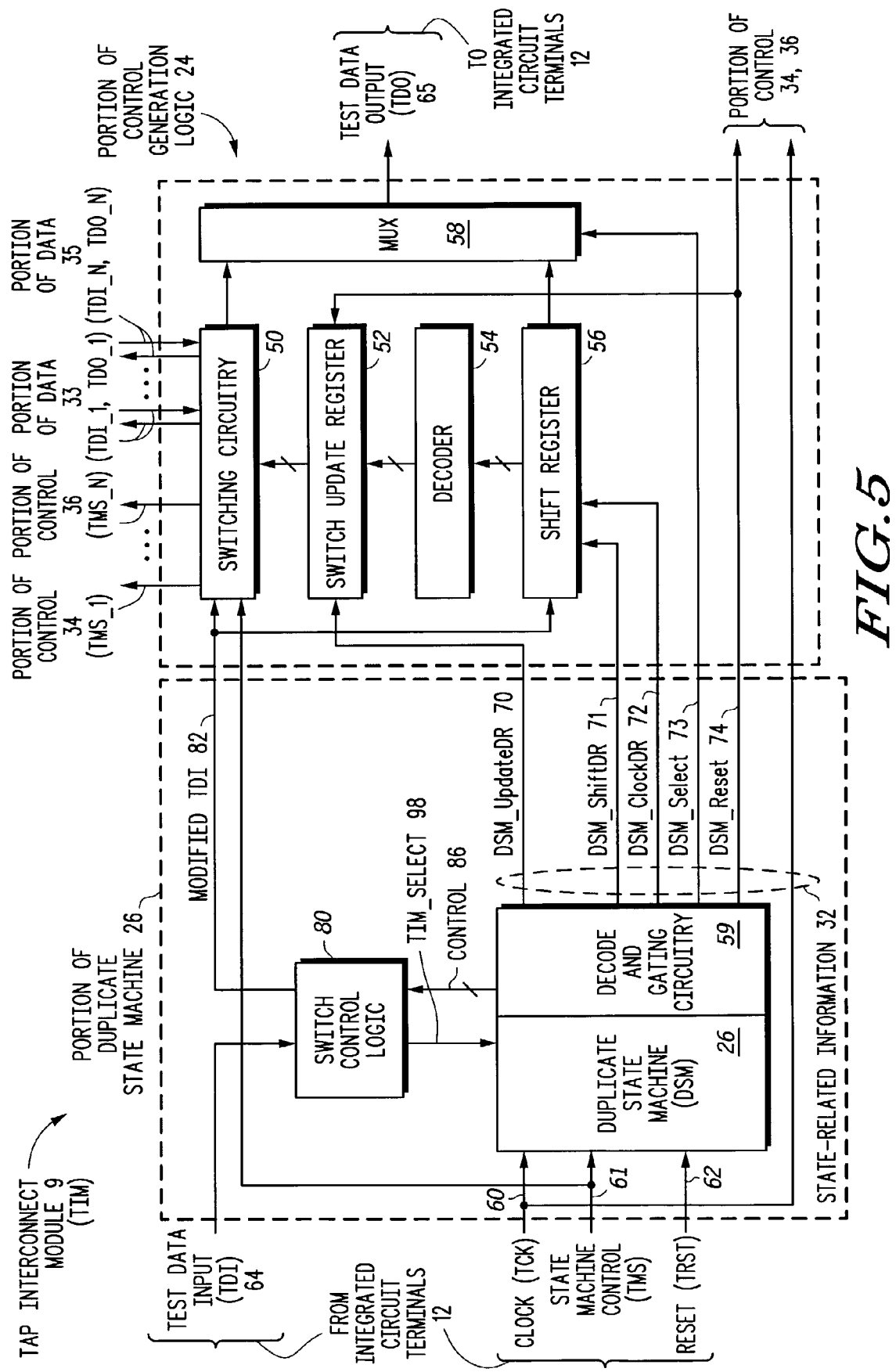
FIG. 5 illustrates, in block diagram form, an alternate embodiment a portion of circuit 18 of FIG. 1 in accordance with the present invention.

FIG. 5 illustrates an alternate embodiment of the present invention which obviates the need for an external IC pin/terminal 12 to control selection of the TIM 9. Instead, a switch control logic block 80 is added to IC 10 to facilitate TIM 9 selection. In addition, the source of test data input (TDI) to switching circuitry 50 is changed from 64 to the modified TDI output 82 of switch control 80. The switch control logic 80 receives the external TDI signal 64 and generates a modified TDI signal 82 using a set of control signals 86 from the duplicate state machine 26. The switch control logic block 80 also generates an additional output signal TIM select 98 which, when asserted, selects the TIM 9. In all other respects, the circuitry of FIG. 5 may operate in the manner described above for FIG. 4.

Figure 6:
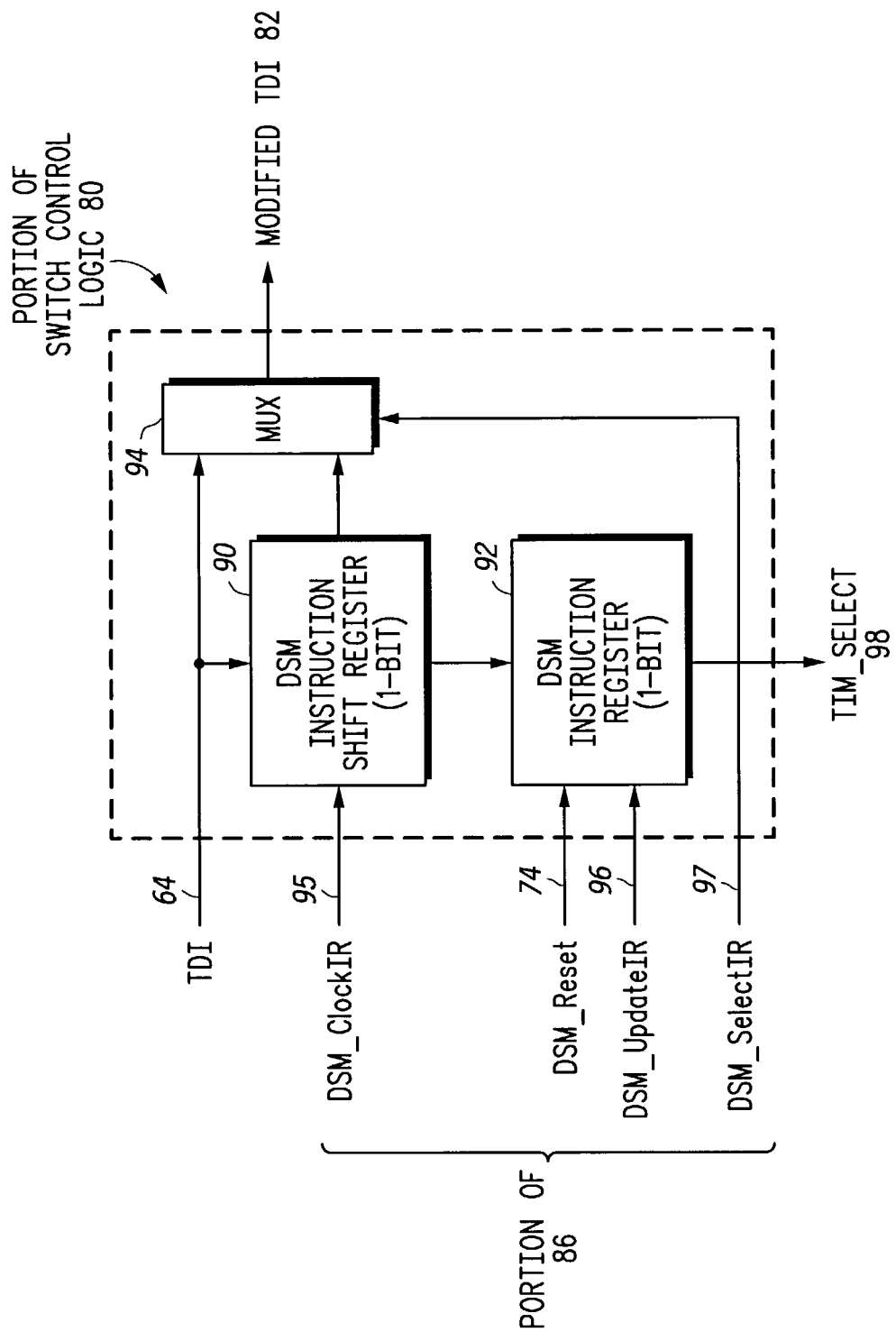
FIG. 6 illustrates, in block diagram form, one embodiment of a portion of switch control logic 80 of FIG. 5 in accordance with the present invention.

FIG. 6 provides details of a portion of the switch control logic block 80 illustrated in FIG. 5. The input signals of FIG. 6 are TDI 64, which is coupled to the external test bus by way of pin/terminals 12 (See FIG. 1), and four control signals that are generated by duplicate state machine 26. The four control signals are: DSM_Reset 74, DSM_ClockIR 95, DSM_UpdateIR 96 and DSM_SelectIR 97. These four control signals are generated during the appropriate states of duplicate state machine 26, and are not conditioned by the selection of TIM 9. When DSM_Reset 74 is asserted, the DSM instruction register 92 is forced to one (1), which de-selects the TIM 9. When a serial scan operation for a data operation is in progress, the external signal TDI 64 passes through multiplexor 94 unaltered by switch control logic 80 and becomes the modified TDI signal 82. When a serial scan operation is in progress for instruction data, DSM instruction shift register 90 is interposed between TDI signal 64 and modified TDI signal 82 by means of MUX 94. DSM_SelectIR 97 is asserted to cause the output of DSM Instruction Shift register 90 to be driven on modified TDI signal 82 by MUX 94. Thus, a distinction between data and instruction operations is provided by the DSM_SelectIR signal 97 which is generated as a decoded output of duplicate state machine 26 and is one of the signals in control logic 86. Shift clocking for DSM instruction shift register 90 and updating of DSM instruction register 92 is controlled by duplicate state machine output signals DSM_ClockIR 95 and DSM_UpdateIR 96, respectively, which are not conditioned by selection of TIM 9.

When instruction data is being shifted, a DSM instruction register bit (DSM Instruction Shift Register 90) is added as an extra shift register bit in the instruction register shift path. An instruction frame is the sum of all of the enabled re-usable module TAP instruction register bit widths. Therefore, when the user selects a new instruction, one more bit is added to the instruction frame for the extra shift register bit for the DSM instruction shift register 90, which has been pre-pended to the concatenated instruction registers of the enabled TAPs in re-usable modules 14, 16.

When an instruction scan is in progress, the DSM_SelectIR signal 97 selects the DSM instruction shift register 90 input of multiplexor 94, which effectively inserts the 1-bit DSM instruction shift register 90 into the instruction scan path. The control signal DSM_ClockIR 96, which is generated by duplicate state machine 26, controls shifting of DSM instruction shift register 90. When the instruction scan operation has completed shifting, thus framing the instruction bits in DSM instruction shift register 90 and the instruction registers of all currently selected TAPs in re-usable modules 14, 16, the TIM_UpdateIR signal 96 transfers the DSM instruction shift register 90 to the DSM instruction register 92 and the value of the TIM_SELECT signal 98 is changed to match the value of DSM shift register bit 90.

When a new configuration of TAPs is desired, the DSM instruction shift register bit 90 for TIM 9 is filled with a zero (0) which will cause the TIM 9 to be selected once the UpdateIR state 115 is reached, and other currently selected TAP instruction registers 130 (see FIG. 2) are filled with bypass instructions, which are effectively a no-operation. When the Update-IR state 115 is entered, DSM instruction shift register 90 is sampled and latched into DSM instruction register 92, and this value is provided as TIM_SELECT 98. Once TIM_SELECT 98 is asserted, decode and gating circuitry 59 will be enabled to generate DSM_ShiftDR 71, DSM_ClockDR 72, DSM_Select 73, and DSM_UpdateDR 70 when in the appropriate DSM states. When a subsequent Shift-DR state 104 is entered, the TIM shift register 56 (see FIG. 5) is coupled to the TDO pin/terminal of IC 10, and new configuration information is shifted into shift register 56. Upon entering the Update-DR state 108, DSM_UpdateDR 70 is asserted, and the decoded shift register value is transferred to the switch update register 52 from decoder 54, which then loads new configuration control data.

It can be seen that the embodiment of the present invention illustrated in FIGS. 5 and 6 adds a single-bit instruction that is pre-pended to the concatenated instructions of all enabled re-usable modules 14, 16. This single-bit instruction is used to determine whether the TIM 9 is selected or disabled for a subsequent data operation. If enabled, the subsequent data operation loads new configuration control information for the switching circuitry 50.

Figure 7:
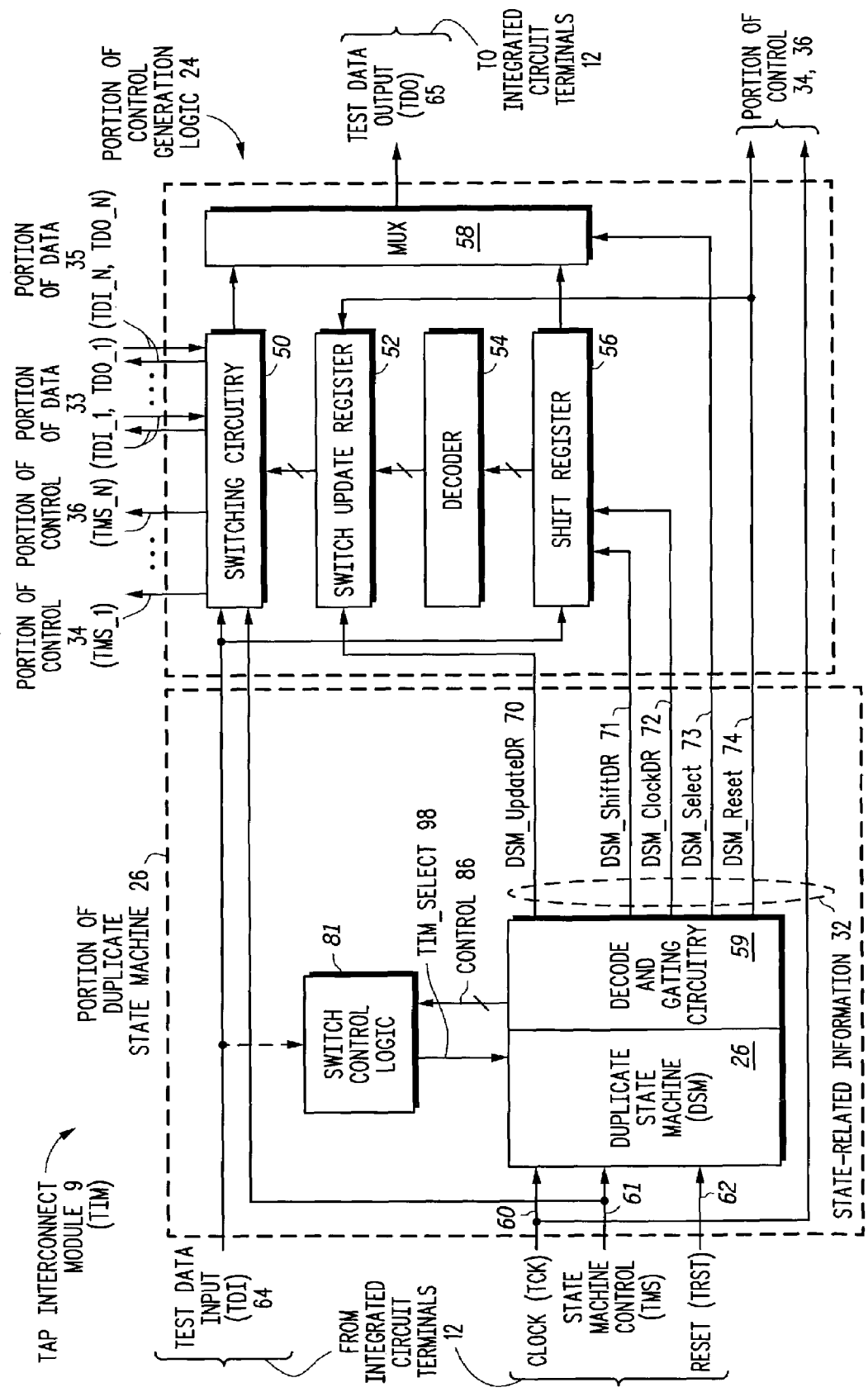
FIG. 7 illustrates, in block diagram form, yet another alternate embodiment of a portion of circuit 18 of FIG. 1 in accordance with the present invention.

FIG. 7 illustrates yet another embodiment of the present invention which solves the issue of TIM 9 selection in an entirely different fashion that requires neither a pin/terminal 12, nor an extension of the instruction register (e.g. 92 in FIG. 6) visible to external logic operating the TAP of IC 10. Instead, internal self-selecting circuitry in switch control logic 81 is used (see FIG. 8) which causes the TIM_SELECT signal 98 to be asserted based on matching a predetermined N-bit signature.

Switch control logic 81 of FIG. 7 includes the signature generation logic (e.g. 140 of FIG. 8) and receives state-related information from duplicate state machine 26 and, optionally, test data input 64. In one embodiment, the signature is based on state information, while in another embodiment the signature is based on the test data input. Alternate embodiments of the present invention may base the signature on a combination of state information and test data input, or may base the signature on whatever information is desired.

Figure 8:
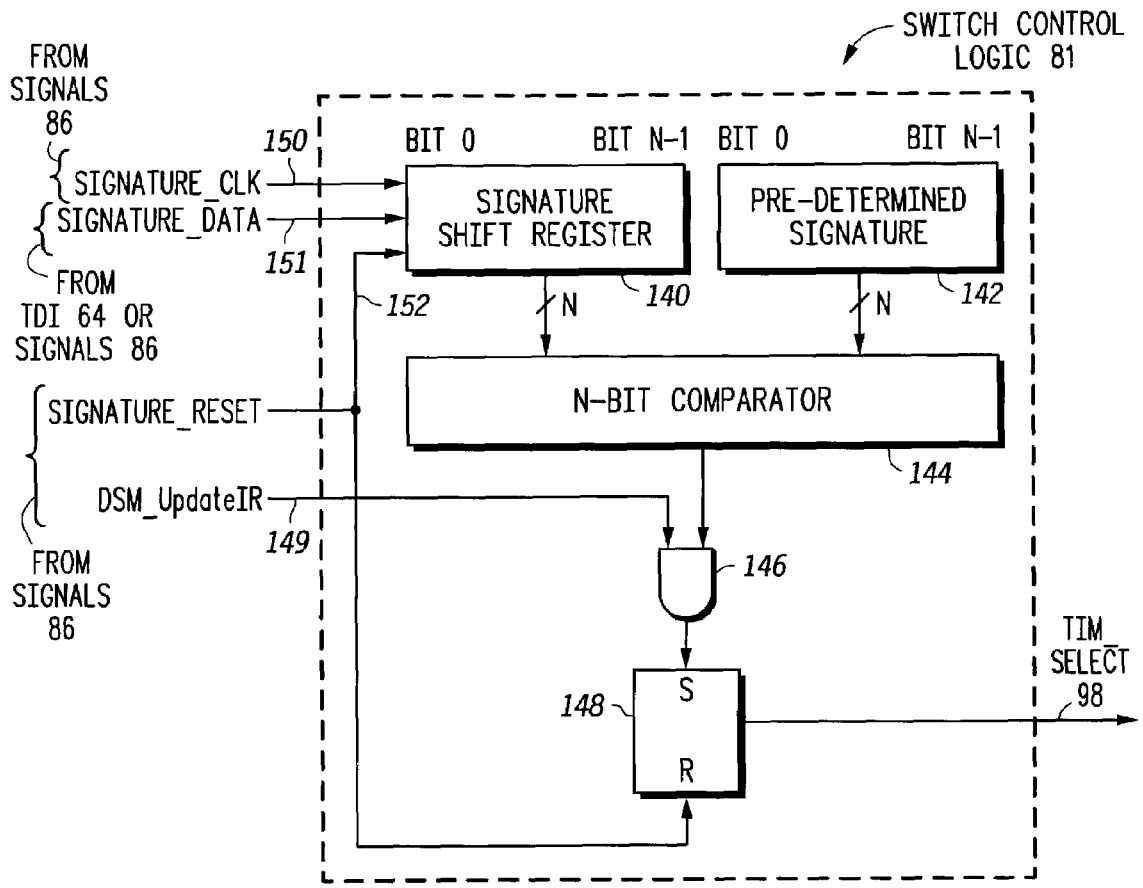
FIG. 8 illustrates, in block diagram form, one embodiment of a portion of switch control logic 81 of FIG. 7 in accordance with the present invention.

FIG. 8 illustrates one embodiment of switch control logic 81 of FIG. 7. The input control signals are Signature_CLK 150, Signature_DATA 151, Signature_RESET 152, and DSM_UpdateIR 149. The N-bit pre-determined signature circuit 142 is a non-volatile storage element that stores one or more predetermined signature values. Circuit 142 may consist of register storage bits, may be hardwired logic levels, or may be provided from signals external to switch control logic 81. When the Signature_RESET signal 152 is asserted, signature shift register 140 is initialized to a non-matching value, the SR latch 148 is reset, and the switch control output signal 84 is driven such that the TIM 9 is not selected.

The signature register clock, Signature_CLK 150, is a gated clock that is "off" until a predetermined event occurs, such as entering a predetermined one of the TAP controller states shown in FIG. 3. Upon triggering the signature register clock, Signature$_{13}$ CLK 150 is enabled to follow the test data clock, TCK 60 (See FIG. 7). Signature_CLK 150 is gated off again upon reaching another predetermined event, such as entering a predetermined one of the TAP controller states shown in FIG. 3. Strict control of the Signature_RESET signal 152 and the Signature_CLK signal 150 are necessary to prevent signature aliasing caused by an unintended signature match.

As N-bits of data are shifted into signature shift register 140, the incoming signature is compared, using N-bit comparator 144, with the expected signature stored in predetermined signature circuit 142. The comparator output 144 is sampled only when the DSM_UpdateIR 149 pulse occurs. The comparator result is then gated by 146 to SR latch 148, which generates output TIM_Select 98 to control TIM 9 selection. If the incoming signature matches the expected signature, SR latch 148 is set, causing the TIM 9 to be selected; otherwise, SR latch remains clear, and the TIM 9 is not selected by switch control 84.

One exemplary method that can be used to construct a signature is to capture a subset of the state traversal history of the DSM TAP controller using the external TMS signal 12 as signature data. With this method, the user is aware of the state history required to generate a matching signal and it is the responsibility of the user to generate this sequence when TIM 9 selection is desired.

To prevent aliasing, the signature shift register 140 is preloaded with a non-matching value by the assertion of the Signature_RESET signal 152 during Capture-IR state 110 (See FIG. 3). The gated clock signal, namely Signature_CLK 150, is then enabled to provide clocking which captures each subsequent TMS value into the signature shift register 140 until Signature_CLK 150 is disabled upon reaching the Shift-IR state 111.

Upon reaching the Shift-IR state 111, Signature_CLK 150 is gated off and the final incoming signature captured in signature shift register 140 is compared with the expected signature stored in predetermined signature circuit 142. During the Update-IR state 115, the comparator output 144 is strobed into the SR latch 148 and the TIM_SELECT signal 98 is asserted if they match and negated if they do not.

Figure 9:
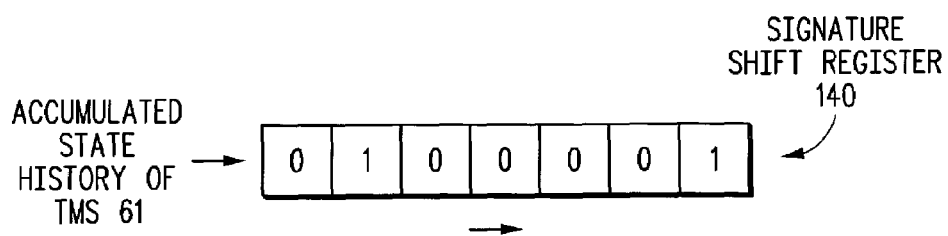
FIG. 9 illustrates, in block diagram form, one embodiment of a signature shift register 140 of FIG. 8 in accordance with the present invention.

FIG. 9 illustrates the result of an exemplary signature produced by the predetermined state traversal sequence shown in bold in FIG. 3. The Signature_DATA signal 151 of FIG. 8 is selected to be TMS 61, which is sampled on the Signature_CLK 150 rising edge, and the predetermined 7-bit signature is the TMS sequence binary 0100001 with the rightmost "1" being sampled on the first rising edge of Signature_CLK 150. The signature of TMS after being enabled in the Capture-IR state 110 matches a traversal of the following states which are shown in bold in FIG. 3: Exit 1-IR 112, Pause-IR 113, Pause-IR 113, Pause-IR 113, Pause-IR 113, Exit 2-IR 114, and Shift-IR 111. Upon reaching the Shift-IR state 111, the signature clock is gated off to stop shifting and the two signatures are compared. The result of the comparison is then loaded into SR latch 148 when the Update-IR state 115 is subsequently traversed. Other state traversal signatures with differing sequence lengths could also be used, as well as the use of other states to enable and disable Signature_CLK 150, and to reset signature shift register 140 and SR latch 148. Other methods of determining a signature comparison are also possible in alternate embodiments of the present invention, for example, selectively enabling and disabling Signature_CLK 150 based on one or more states of DSM 24, 26, or based on one or more particular state transitions of DSM 24, 26.

Other signature methods could be used as well. For example, while in the Pause-IR state 113, the TDI 64 pin/terminal 12 value is normally of no consequence. Therefore, a signature-based method of selecting the TIM 9 could be based on sampling the TDI pin/terminal 12 for N times while in the Pause-IR state 113, and then looking for a predetermined unique N-bit signature. The user of IC 10 would be made aware of the matching sequence and would have the responsibility for generating the predetermined sequence of events to create a matching signature when access to the TIM 9 is desired. In this method, the Signature_RESET signal 152 is triggered by a state other than the Pause-IR state 113 to initialize the signature shift register 140. The Signature_CLK signal 150 is enabled only while in the Pause-IR state 113. The user of IC 10 would keep the TAP controller in the Pause-IR state 113 for the required number of clocks to provide the expected sequence of values on the TDI pin/terminal 12, which then causes assertion of the TIM_SELECT signal 98 in the Update-IR state 115 state.

Combinations of signatures utilizing one or more captured sequences of state history combined with one or more captured sequences of TDI 64 input values may also be used to enable selection of TIM 9 for access. As can be seen, the scope of the present invention is not limited to a particular sequence or method of capture of signature information for the purpose of selecting the TIM 9.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Note that the present invention is not limited to any particular test standard (e.g. the IEEE Standard 1149.1), and in fact is not limited in any way to the test area. For example, the present invention is useful in any application where there is no or limited capability to modify an original state machine. For example, if additional capability for an original state machine is desired (in any mode, including normal operation, test, etc.), the additional capability can be added to the duplicate state machine and the control signal(s) output from the duplicate state machine can be routed from the duplicate state machine to the output of the original state machine or to wherever the control signal(s) are to be used. This may be a very useful approach when integrating one or more blocks of original or pre-existing circuitry onto a single integrated circuit.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for configuring an integrated circuit, comprising:
   providing a test input terminal;
   providing a first state machine in a first re-useable module;
   providing a duplicate first state machine which has identical states as the first state machine and which duplicates state transitions of the first state machine;
   using the duplicate first state machine to cumulatively track a plurality of state transitions of the first state machine to produce an actual state transition pattern;
   comparing the actual state transition pattern and a predetermined state transition pattern; and
   if the actual state transition pattern and the predetermined state transition pattern match, reconfiguring which portion of the integrated circuit is coupled to receive information from the test input terminal.

2. A method as in claim 1, wherein to portion of the integrated circuit coupled to receive information from the test input terminal comprises a test interconnect module.

3. A method as in claim 1, wherein the portion of the integrated circuit coupled to receive information from the test input terminal comprises a switch update register.

4. A method as in claim 1, wherein modifying contents of a switch update register modifies which portion of the integrated circuit is subsequently coupled to receive information from the test input terminal.

5. A method as in claim 1, wherein the portion of the integrated circuit coupled to receive information from the test input terminal comprises a scan chain in the first re-usable module.

6. A method as in claim 1, wherein said step of comparing the actual state transition pattern and a predetermined state transition pattern comprises:
providing a comparison result in response to the JTAG Update-IR state.

7. A method as in claim 1, wherein said step of reconfiguring which portion of the integrated circuit is coupled to receive information from the test input terminal comprises:
adding at least one bit to determine whether reconfiguring is disabled for a subsequent data operation.

8. A method as in claim 1, wherein said step of reconfiguring which portion of the integrated circuit is coupled to receive information from the test input terminal comprises adding no new JTAG instructions.

* * * * *